(12) United States Patent
Hubaux

(10) Patent No.: US 12,675,085 B2
(45) Date of Patent: Jul. 7, 2026

(54) METHOD AND APPARATUS FOR PREDICTING A PROCESS METRIC ASSOCIATED WITH A PROCESS

(71) Applicant: ASML NETHERLANDS B.V., Veldhoven (NL)

(72) Inventor: Arnaud Hubaux, Erpent (BE)

(73) Assignee: ASML NETHERLANDS B.V., Veldhoven (NL)

( * ) Notice: Subject to any disclaimer, the term of this patent is extended or adjusted under 35 U.S.C. 154(b) by 809 days.

(21) Appl. No.: 17/910,086

(22) PCT Filed: Feb. 24, 2021

(86) PCT No.: PCT/EP2021/054597
§ 371 (c)(1),
(2) Date: Sep. 8, 2022

(87) PCT Pub. No.: WO2021/197717
PCT Pub. Date: Oct. 7, 2021

(65) Prior Publication Data
US 2023/0124106 A1 Apr. 20, 2023

(30) Foreign Application Priority Data

Apr. 2, 2020 (EP) ..................................... 20167729
Apr. 20, 2020 (EP) ..................................... 20170414

(51) Int. Cl.
*G05B 13/04* (2006.01)
*G05B 13/02* (2006.01)
*H10P 74/20* (2026.01)

(52) U.S. Cl.
CPC ....... *G05B 13/048* (2013.01); *G05B 13/0265* (2013.01); *H10P 74/20* (2026.01)

(58) Field of Classification Search
CPC .. G05B 13/048; G05B 13/0265; G05B 17/02; G05B 2219/32193; G05B 2219/32194;
(Continued)

(56) References Cited

U.S. PATENT DOCUMENTS 6,952,253 B2    10/2005  Lof et al.
10,209,974 B1 *    2/2019  Patton ....................... G06F 8/60
(Continued)

FOREIGN PATENT DOCUMENTS

EP          3767392          1/2021
NL          2024627          1/2020
(Continued)

OTHER PUBLICATIONS

International Search Report and Written Opinion issued in corresponding PCT Patent Application No. PCT/EP2021/054597, dated May 27, 2021.
(Continued)

*Primary Examiner* — Nha T Nguyen
(74) *Attorney, Agent, or Firm* — Pillsbury Winthrop Shaw Pittman, LLP

(57)          ABSTRACT

A method including: obtaining one or more models configured for predicting a process metric of a manufacturing process based on inputting process data; and using a reinforcement learning framework to evaluate the one or more models and/or model configurations of the one more models based on inputting new process data to the one or more models and determining a performance indication of the one or more models and/or model configurations in predicting the process metric based on inputting the new process data.

18 Claims, 4 Drawing Sheets

(58) Field of Classification Search
CPC .... G05B 2219/45031; G05B 19/41875; H01L
22/10; Y02P 90/02; G06N 3/006; G06N
20/00; G06N 5/01; G06N 7/01; G03F
7/705
See application file for complete search history.

(56) References Cited

U.S. PATENT DOCUMENTS

| | | | |
|---|---|---|---|
| 2009/0228129 A1 | 9/2009 | Moyne et al. | |
| 2014/0351773 A1* | 11/2014 | Cao | G03F 7/70525 |
| | | | 716/53 |
| 2016/0148850 A1 | 5/2016 | David | |
| 2017/0109646 A1* | 4/2017 | David | G03F 7/70625 |
| 2017/0206469 A1* | 7/2017 | Das | G05B 13/048 |
| 2019/0236455 A1 | 8/2019 | Taylor et al. | |
| 2019/0369605 A1* | 12/2019 | Nakada | G05B 19/41865 |
| 2020/0027021 A1* | 1/2020 | Sastry | G06N 20/00 |

FOREIGN PATENT DOCUMENTS

| | | |
|---|---|---|
| TW | 201816670 | 5/2018 |
| WO | 2018202361 | 11/2018 |

OTHER PUBLICATIONS

Taiwanese office Action issued in corresponding Taiwanese Patent
Application No. 110109925, dated Nov. 26, 2021.

* cited by examiner

400

METHOD AND APPARATUS FOR PREDICTING A PROCESS METRIC ASSOCIATED WITH A PROCESS

CROSS-REFERENCE TO RELATED APPLICATIONS

This application is the U.S. national phase entry of PCT Patent Application No. PCT/EP2021/054597 which was filed on Feb. 24, 2021, which claims priority of European Patent Application No. 20167729.1 which was filed on Apr. 2, 2020 and of European Patent Application No. 20170414.5 which was filed on Apr. 20, 2020 which are incorporated herein in their entireties its entirety by reference.

FIELD

The present invention relates to computer-implemented methods and apparatus for predicting a process metric associated with a process. Specifically, it relates to selecting, from a plurality of model configurations, a model configuration for predicting the process metric. The methods and apparatus may be applicable to industrial manufacturing processes, for example semiconductor manufacturing processes.

BACKGROUND

Manufacturing processes, such as processes of patterning semiconductor substrates, typically require adequate registration of features characterizing the manufacturing process to monitor whether the process is stable. Examples of such features are Key Performance Indicators (KPI's) associated with equipment used in the manufacturing and characteristics of features provided to substrates. Often values of those features are referred to as process data.

Process data is crucial as input to prediction models being used to infer expected characteristics of the manufacturing process, such as yield of the process or the quality of individual substrates after being processed. It is common nowadays that such prediction models are further used in controlling the process, such as modifying operational parameters of manufacturing equipment and/or assist in making re-work decisions for individual substrates after being subject to one or more process steps.

Current use of prediction models is however rather static and therefore prone to losing accuracy over time, as a) often the features characterizing the manufacturing process demonstrate a significant evolution (drift, jumps) and/or b) the volume of process data is not fixed, but increases in time, hence very often an initially selected prediction model or prediction model configuration is not optimal anymore at a later point in time.

SUMMARY

It is an object of the invention to overcome the disadvantages of the state of the art methods.

According to a first aspect of the disclosure, there is provided a computer implemented method of selecting, from a plurality of model configurations, a model configuration for predicting a process metric associated with a process. The method comprises: obtaining process data comprising values associated with the plurality of model configurations and a value associated with a feature of the process, evaluating a performance indication for each model configuration of the plurality of model configurations based on the process data, selecting a model configuration based on the evaluated performance indication, predicting the process metric using a model having the selected model configuration, and outputting, by the computer, the predicted process metric.

The process may comprise one of: industrial processing, industrial manufacture, weather prediction, traffic management, network management, economic prediction, medical diagnostics, or any other process in a complex environment.

The process metric may comprise a characteristic of the process. The process metric may comprise one of: yield, quality of process, probability of failure of process, probability of failure of a component in the process environment, diagnostics status.

Predicting the process metric may comprise providing, as input to a model with the selected model configuration, values associated with a feature of the process and receiving, as output from the model, a prediction of the process metric.

Steps of the method may be performed by one or more processors of a computer system.

The process data may comprise values associated with a single feature or multiple features associated with the environment in which the process occurs and a single characteristic or multiple characteristics of the process. The features may represent a state of the environment in which the process takes place. Examples of features are critical dimension, temperature, power.

Values associated with the plurality of model configurations may comprise the current set of model configurations in the environment. Values associated with the plurality of model configurations may comprise an accuracy of a previously predicted process metric predicted using a previously selected model configuration. That is, the method may be performed iteratively and use data from previous iterations. The accuracy may be determined using standard performance measurement techniques e.g. the area under a receiver operating characteristics (AUC-ROC) value or precision and recall.

The performance indication may represent a measurement of the performance (e.g. accuracy) of a prediction made by a selected model. Said performance indication may be determined analytically, for example using an advantage function or temporal difference.

Using this method, a different model configuration may be selected if its performance exceeds the performance of a current model configuration. Beneficially, such a method yields the following advantages:

A process metric may be predicted with increased accuracy. In particular, the accuracy may be higher than what can be achieved using manual intervention, for example because the methods described herein are data-driven rather than heuristic. Selecting a model configuration using the methods described herein is significantly faster than what can be achieved using manual intervention, thereby allowing for real-time updates to a prediction process. Using and applying corrections using the methods described herein may increase the yield of a process, for example as the process is optimised and downtime is avoided. The methods described herein are also very flexible, as the methods may be applied to many environments and processes, and may be trained to learn new environments and processes and/or learn changes within environments and processes.

Additionally, by using the methods described herein, a model selection tool is provided which requires less storage space than conventional methods, for example because fewer models need to be stored. In particular, fewer models need to be stored as the selection of a model configuration allows for models to be updated in response to new data, rather than requiring a completely new model.

The value associated with a feature of the process may comprise data associated with a way the feature changes over time.

The data associated with a way the feature changes over time may be referred to as temporal change data. The temporal change data may comprise values associated with a monitored feature over time. A drift status may be determined based on the temporal change of the feature. The drift status may be used to identify a drift event. The drift status may comprise one of the following: no drift, sudden drift, gradual drift, incremental drift, recurring concept drift. The drift status may alternatively be determined periodically, for example after a selected time period has passed.

Each model configuration may comprise one or more of a model type, model parameters and/or model hyperparameters.

The model type may represent a type of model architecture and/or type of algorithm. The model parameters may represent parameters which are determined during training of the model using training data. The model hyperparameters may represent parameters of the model which are typically set prior to training. Examples of hyperparameters are greediness, learning rate, number of layers.

Selecting the model configuration may comprise selecting a first model with a first model type, first model parameters and first model hyperparameters The first model type and/or first model parameters and/or first model hyperparameters may be the same as a previous model type, previous model parameters and previous model hyperparameters of a previously selected model. That is, it may be determined that it is beneficial to retain the same model configuration as previously selected. Alternatively, one or more of the first model type, first model parameters and first model hyperparameters may be different to the previous model type, previous model parameters and/or previous model hyperparameters.

The model type may comprise a support vector machine, a neural network, or a random forest.

Selecting a model configuration may comprise retraining a model to update its model parameters. In particular, retaining the model may be performed after a drift event. The model may be retrained using values associated with one or more features of the process.

Selecting the model configuration may be further based on a dataset comprising values associated with the feature of the process. The dataset may comprise stored values from previous iterations of the method. The dataset may comprise previously measured values associated with the feature of the process.

Selecting the model configuration may be further based a size of the dataset or a size of a subset of the dataset. The size of the dataset may comprise a number of values in the dataset. The subset may comprise a set of values in the dataset associated with a particular feature. It may be determined that it is beneficial to switch from one model type to a different mode type if the size of the dataset or the size of the subset of the dataset exceeds a predetermined threshold.

The method steps may be performed using reinforcement learning. The method steps may be performed as at least part of a model-free reinforcement learning (MFRL) framework.

The steps of obtaining process data, evaluating a performance metric and selecting a model configuration may be performed using one or more of an actor critic algorithm, an advantage actor-critic algorithm, an asynchronous advantage actor-critic algorithm, a Q-learning with normalized advantage function, a trust region policy optimization algorithm, a proximal policy optimization algorithm, a twin delayed deep deterministic policy gradient, or a soft actor-critic algorithm.

The steps of obtaining process data and evaluating a performance metric may be performed by one or more processors comprising a critic and the step of selecting a model configuration is performed by one or more processors comprising an agent.

The steps of obtaining process data, evaluating a performance metric and selecting a model configuration may comprise: determining a policy function, $J(\theta)$, that defines a selection approach for selecting a model configuration; and/or determining a value function, $V(\theta)$, that defines an enhancement of the process metric prediction assuming the policy function is followed until completion of the policy function. That is, the reinforcement learning framework may comprise a policy-based framework and/or a value-based framework.

The selection approach may be defined as governing the way in which the model configuration is selected. The selection approach may comprise an algorithm which may be based on the total rewards until completion of the policy. Gradient ascent may be used to optimise the policy function.

The method may further comprise determining a correction to the process based on the predicted process metric. The correction may be determined based on the predicted process metric and/or a value associated with a feature of the process. The correction may be determined so as to improve a performance metric of the process. In this method where a correction is determined, the method may be referred to as a method for determining an correction to a process.

The method may further comprise applying said correction to the process. The correction may be applied selectively, for example it may be applied only if the predicted process metric passes a threshold. In this method where an adjustment is applied, the method may be referred to as a method for applying an adjustment to a process. The application of an adjustment may improve the process metric of the process.

The process may comprise a semiconductor manufacturing process. The semiconductor manufacturing process may be performed on a semiconductor manufacturing apparatus, for example a lithographic apparatus. The semiconductor manufacturing apparatus may comprise, or may be in communication with, a measurement apparatus arranged to measure a feature of the process.

The correction may be determined to adjust an optical and/or mechanical parameter of a semiconductor manufacturing apparatus arranged to perform the semiconductor manufacturing process, or to change a processing step of the semiconductor manufacturing process. For example, the dose at a particular step of the semiconductor manufacturing process may be changed. In another example, a beam of radiation may be adjusted to a different position using optical and/or mechanical adjustments.

The value associated with a feature of the process may be generated by an inspection apparatus arranged to monitor at least a portion of the semiconductor manufacturing process. The inspection apparatus may be referred to as a metrology tool. The inspection apparatus may be arranged to inspect substrates to measure features of substrates and/or patterned structures on substrates, such as overlay errors between subsequent layers, line thicknesses or critical dimensions.

According to a second aspect of the disclosure there is provided a method of training an evaluation model for evaluating a performance indication for each model configuration of a plurality of model configurations, for a set of models having said plurality of model configurations and being configured to predict a process metric associated with a process, the method comprising: receiving prediction data relating to a predicted process metric predicted by at least one of the set of models, receiving values associated with a feature of the process, and training the evaluation model based on the received values and received prediction data.

The evaluation model may comprise a policy function used by a critic of a reinforcement learning model. That is, the evaluation model may be performed by one or more processors comprising a critic. Training the evaluation model may comprise updating the policy function based on the received values and received prediction data.

According to a third aspect of the disclosure there is provided a method of training a selection model for selecting a model configuration from a plurality of model configurations, for a set of models having said plurality of model configurations and being configured to predict a process metric associated with a process, the method comprising: receiving values associated with a feature of the process, receiving a performance indication indicative of the performance of a specific predicted process metric predicted using a specific model configuration, and training the selection model based on the received values and received performance indication.

The selection model may comprise a policy function used by an agent of a reinforcement learning model. That is, the selection model may be performed by one or more processors comprising an agent. Training the selection model may comprise updating the policy function based on the received values and received performance indication. More than one performance indication may be received, for example indicative of the performance of multiple specific predicted process metrics each predicted using a different model configuration.

According to a fourth aspect of the disclosure there is provided a machine learning model trained according to the second or third aspect. The machine learning model may be stored on a computer storage medium.

According to a fifth aspect of the disclosure there is provided a method, the method comprising: obtaining one or more models configured for predicting a process metric of a manufacturing process based on inputting process data; and using a reinforcement learning framework to evaluate said one or more models and/or model configurations of said models based on inputting new process data to the one or more models and determining a performance indication of the one or more models and/or model configurations in predicting the process metric based on inputting the new process data.

Each model for predicting a process metric of a manufacturing process may have a model configuration. The performance indication may represent a measurement of the performance (e.g. accuracy) of a prediction made by a selected model.

The process metric may be associated with a yield or quality parameter of the manufacturing process.

The model configuration may comprise one or more of a model type, model parameters and/or model hyperparameters.

The process data and new process data may comprise features of the manufacturing process. The process data may comprise a dataset such as a validation set, training set or test set. Process data may comprise values associated with one or more features associated with the manufacturing environment and/or one or more characteristics of the manufacturing process. New process data may be process data which has not been previously inputted to the model. New process data may be process data measured during the manufacturing process, e.g. using a metrology tool.

The manufacturing process may comprise a process of patterning semiconductor wafers.

The performance indication may be based on comparing the predicted process metric and an otherwise obtained value of the process metric.

The method may further comprise selecting a model and/or model configuration based on the evaluation.

The process metric may be indicative of a quality of a substrate being subject to the patterning process.

The process data may comprise Key Performance Indicators (KPIs) associated with a plurality of functional modules involved in the manufacturing process.

The one or more models may comprise at least two machine learning based models, each model being of a different architecture.

The one or more models may comprise at least a first model based on supervised learning and a second model based on unsupervised learning.

According to a sixth aspect of the disclosure there is provided a computer program comprising instructions operable to execute the method of the first, second, third and/or fifth aspect, when run on a suitable apparatus.

According to a seventh aspect of the disclosure there is provided a computer storage medium comprising the computer program of the sixth aspect.

According to a eighth aspect of the disclosure there is provided a semiconductor manufacturing apparatus comprising processing means and a storage medium comprising instructions operable to execute the method of the first, second, third or fifth aspect.

BRIEF DESCRIPTION OF THE DRAWINGS

Embodiments of the invention will now be described, by way of example only, with reference to the accompanying schematic drawings, in which.

DETAILED DESCRIPTION

Figure 1:
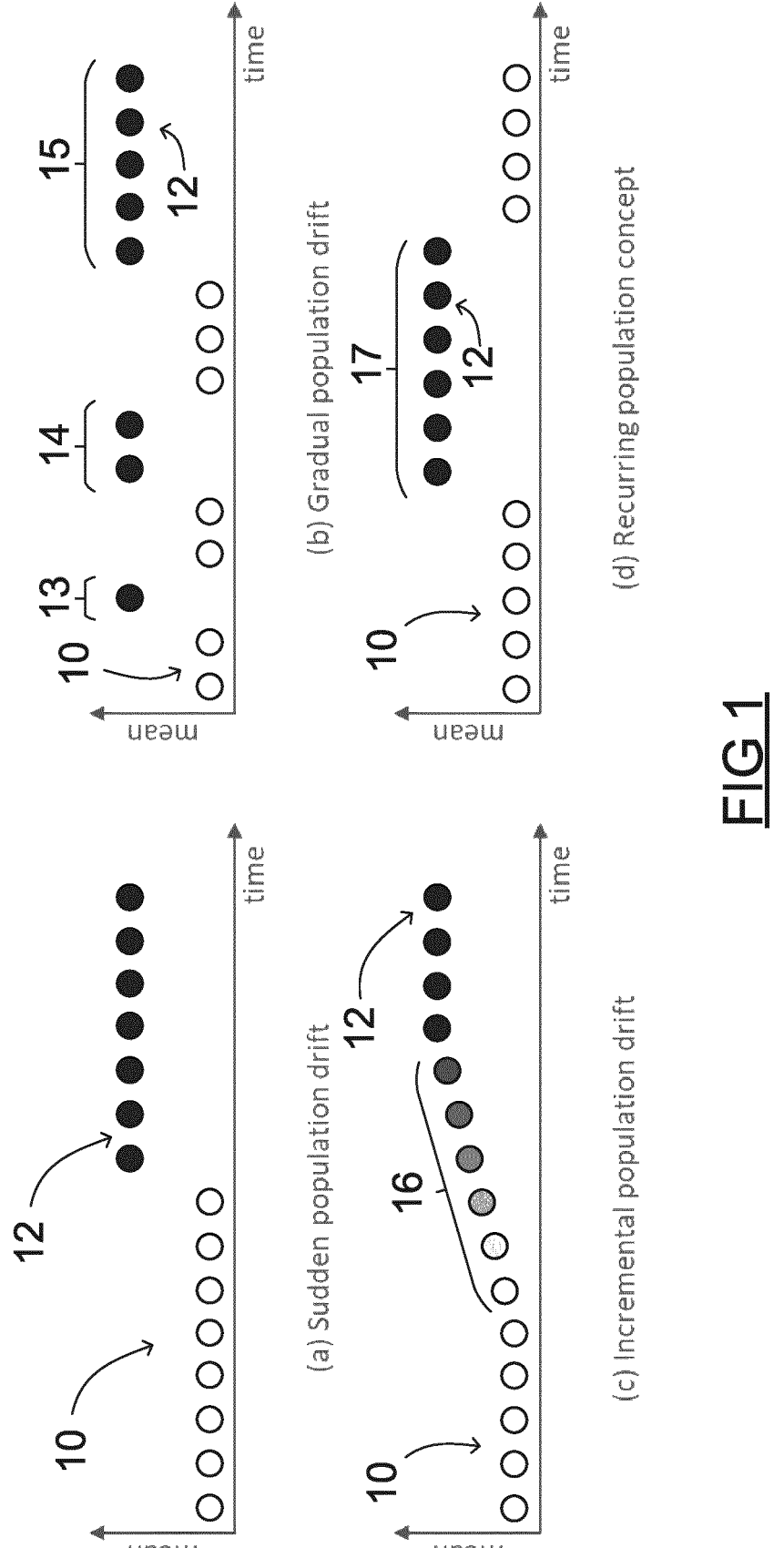
FIG. 1 illustrates common drift events observed in a complex environment.

Machine learning models can be used to predict characteristics in a complex environment. Machine learning models may comprise different types of model, for example, artificial neural networks, decision trees, support vector machines, and/or Bayesian networks. Machine learning models may be referred to herein as models.

Each model has a set of model parameters, the values of which are derived via training. Machine learning models may be trained using techniques such as supervised learning, unsupervised learning or reinforcement learning. In training, training data associated with the environment is provided to the model such that the model may be trained to recognise patterns within the data and update model parameters. After training, the model can be used to predict characteristics in the environment based on received data associated with the environment.

Each model also has a set of hyperparameters, the values or types of which are typically selected prior to training. Hyperparameters may comprise, for example, the learning rate of a model, the depth of a tree in a decision tree model, the number of layers and/or neurons in a neural network, exploration vs. exploitation in a reinforcement learning model.

When using a model to predict characteristics in a complex environment, the type of model and model hyperparameters may be selected based on the type of environment, amount of data and/or type of data received from the environment. Furthermore, the model is provided with training data from the environment such that it is trained to predict specifically for that environment. Consequently, each model is tailored to a specific environment.

Models may be used to predict characteristics in a range of environments and/or processes within such environments. Examples of such environments are industrial processing and/or manufacturing environments, weather systems, traffic systems on roads or waterways, crowds in public places, computer networks, economic systems such as stock markets, medical diagnostic systems for use on the human or animal body (or ex vivo samples thereof). For example, a model may be used to predict a characteristic (e.g. a yield, quality, throughput, maintenance status, diagnostic status) associated with an industrial process in an industrial manufacturing or processing environment. A model may be used to predict a likelihood and/or location of a weather type or event (e.g. hurricane, heatwave) in a local or global weather system. A model may be used to predict movement in complex environments, for example the movement of animals in herds, the movement of people in crowds or the movement of traffic on roads. A model may be used to predict resilience and/or dropout in a computer network. A model may be used in medical diagnostics, for example predicting a likelihood of a medical condition based on data received from a medical device. Some characteristics in the environment are associated with features which may be measured, for example temperature, concentration or speeds, and may be referred to simply as features. Some characteristics in the environment are associated with a process which occurs within the environment (e.g. yield of a process, likelihood of a successful diagnosis), and may be hence referred to as process metrics.

The above environments, and others, are complex and dynamically change over time. Each environment is affected by multiple internal and/or external stimuli. The relationship between each stimulus and the effect it has on the environment is typically not well understood. A machine learning model, given training data from the environment, may be trained to predict characteristics of the environment, regardless of whether the model can determine the specific stimuli and/or the specific effect of a stimulus on the environment.

Many complex environments experience drift, wherein the mean value of a characteristic changes systematically over time. The occurrence of drift at a particular time or time period may be referred to as a drift event. FIGS. 1(a)-1(d) illustrates common drift events observed in complex environments. Each drift event is illustrated using a measured mean value of a characteristic of the environment, measured over time. In each case, the measured value transitions from a first mean value 10 to a second mean value 12 in a drift event.

A drift event, depicted in FIG. 1(a), referred to as sudden population drift, occurs when the measured value transitions from the first mean value 10 to the second mean value 12 generally discontinuously. The measured value remains at the second mean value 12 following the transition. In an example, a sudden population drift may occur when a discontinuous adjustment is made to an environment e.g. a change of operating parameters of a manufacturing apparatus, a volcano eruption or solar event affecting a weather system, etc.

A second drift event, depicted in FIG. 1(b), referred to as gradual population drift, occurs when the measured value transitions between the first mean value 10 to the second mean value 12, the transition involving increasingly long periods at the second mean value 12 between decreasing periods at the first mean value 10. This may occur multiple times. The transition between first and second mean values 10, 12 is generally discontinuous. Each time the first mean value 10 transitions to the second mean value 12, the amount of time the measured value remains at the second mean value 12 increases. In the example illustrated in FIG. 1, the measured value remains at the second mean value for a first time period 13, a second time period 14, and a third time period 15, wherein the third time period 15 is greater than the second time period 14 and the second time 14 period is greater than the third time period 13. Examples of gradual population drift in a real environment is an intermittent fault which increases in severity over time, for example due to the build-up of debris in an apparatus and symptoms of a medical condition where the patient is treated by way of increasing dosages of a medicament to which the patient develops a tolerance or resistance.

A third drift event, depicted in FIG. 1(c), referred to as incremental population drift, occurs when the measured value begins at the first mean value 10 and gradually transitions to the second mean value 12, for example in a gradual incremental increase or gradual incremental decrease. That is, the transition is generally continuous over a transition period 16. An example of incremental population drift is a manufacturing apparatus which gradually increases in temperature, leading to an incremental increase in, for example, yield. A further example may be an atmospheric effect caused by a build-up of a pollutant over time.

A fourth drift event, depicted in FIG. 1(d), referred to as recurring population concept, occurs when the measured value begins at the first mean value 10 and transitions to the second mean value 12. The transition between the first and second mean value 10, 12 is generally discontinuous. The measured value remains at the second mean value 12 for a fourth time period 17, before transitioning to the first mean value 10. An example of a recurring population concept in a real environment is the occurrence of an intermittent fault in an industrial machine, or symptoms of a medical condition that exhibits flares (or "flare-ups").

Trained machine learning models effectively use historical data from the environment to learn. For example, a machine learning model may use training data from a time period in which the measured value is at the first mean value 10. After the drift event, the measured value is at the second mean value 12. As such, the trained model is less able to accurately predict a characteristic following a drift event (i.e. may predict the characteristic with reduced accuracy).

Drift events, as described above, may be associated with the drift in a value associated with a feature in the environment. Such a drift event may be referred to as a feature drift. Drift events may, however, be associated with other quantities. For example, a drift event may correspond to a drift in a process metric, for example a decrease in yield. Such a drift event may be referred to as process drift. In another example, a drift event may correspond to a performance metric associated with the model used to predict the characteristic. That is, the performance of the model's prediction may be determined, for example using standard performance measurement techniques (e.g. the area under a receiver operating characteristics (AUC-ROC) value, or precision and recall), and the determined performance may increase or decrease in a drift event similar to those described above.

In order to increase the accuracy of predicting a characteristic in an environment following a drift event, it may be beneficial to update the model. For example, the model may be retrained using training data from a time period in which the measured value is at the second mean value 12. Additionally or alternatively, the model architecture and/or hyperparameters may be updated. Such updating processes may be referred to as selecting a model configuration, wherein the model configuration comprises a specific model type, architecture, parameters and hyperparameters.

Generally, selection of a model configuration is performed through manual intervention in which a human operator manually chooses a model configuration. Manual intervention may comprise a 'heuristic' approach wherein the model configuration is selected based on intuition. Heuristic approaches are typically of low accuracy. Key performance indicators (KPIs) may be used to improve a heuristic approach, for example by monitoring a KPI such that a process within the environment stays within a desired performance window (i.e. a performance which is defined as 'adequate'). KPIs may utilize statistical analysis to select a model configuration. However, manual intervention (including that using statistical analysis) is typically unable to understand the complex relationships between model configurations and prediction quality. For example, it may not be understood how altering the learning rate may or may not improve a prediction and/or when retraining to update model parameters may be beneficial). Additionally, manual intervention may not be capable of updating the model with the speed required for real-time updating. Additionally, manual intervention methods are typically incapable of responding specifically to a drift event.

Herein is described improved methods and systems for selecting a model configuration. The techniques described herein provide an improved way of selecting or updating a model configuration such that predictions of a characteristic in an environment are improved. The present techniques provide for responsive, real-time updating of the model, hence providing predictions that are responsive to changes in the environment, for example changes caused by drift events. Methods described herein may be fully automated, therein reducing or removing the need for manual intervention.

Figure 2:
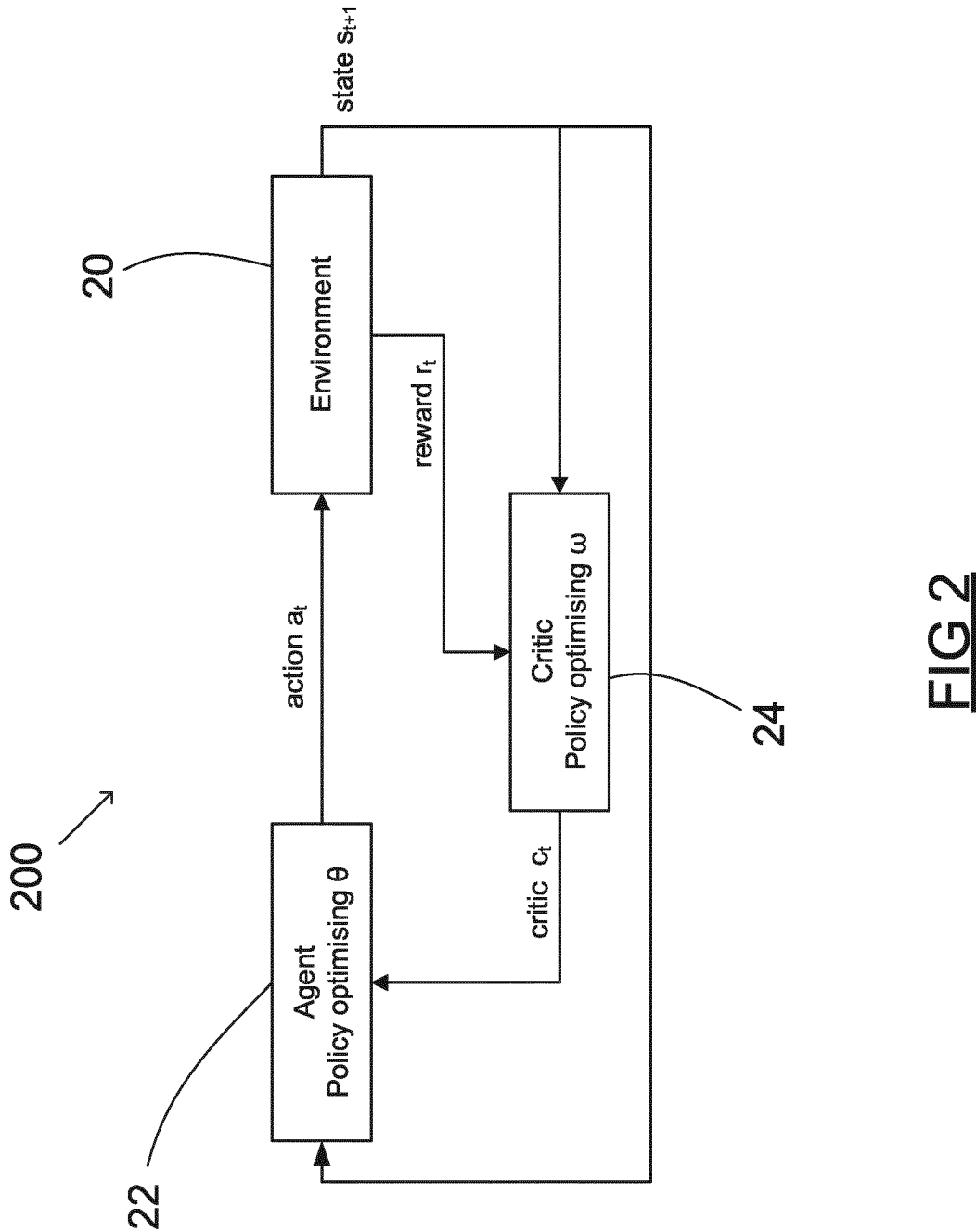
FIG. 2 depicts a model selection model.

FIG. 2 depicts a model selection model 200 which may be used to select a model configuration. The model selection model 200 comprises a reinforcement learning model. The model selection model 200 is used with an environment 20, which comprises one of the example environments discussed above, or another complex environment.

The environment 20 is initially in a state $s_t$ at a time t. The state $s_t$ comprises both a dataset D and a set of model configurations M. The dataset D comprises one or more values associated with features of the environment (e.g. temperature in a weather system, a power in an industrial processing environment, etc.). The features may be measured, for example by a metrology apparatus. It should be understood that individual data entries within the dataset D may be referred to as features or as values associated with features, indicating that the features are represented numerically in the form of data entries.

From the dataset D, a drift status F may be determined. The drift status F may identify a drift event, and optionally one or more features of said drift event (e.g. type of drift event, magnitude of drift, etc.). The drift status may be determined by monitoring a feature over time, and identifying the way the feature changes over time. For example, the value associated with the feature may change discontinuously to a new value, and remain at the new value, indicating a sudden population drift.

Any number of features may be monitored to determine drift. Data associated with the way a feature changes over time may be referred to as temporal change data. Such temporal change data and/or drift status may be stored in the dataset D.

The environment 20 also comprises a set of trained machine learning models, which have been trained to predict a characteristic in the environment. For example, they may have been trained on historical data in the dataset D. Each machine learning model has a model configuration. The set of model configurations M is therefore the configuration of each model in the set. The set of models may comprise any type of model, for example they may comprise neural networks and/or reinforcement learning models operable to predict a characteristic in the environment.

Each model of the set of models in the environment 20 is operable to predict a characteristic of the environment. At a given time, a model (with an associated model configuration) is selected to predict the characteristic. The aim of the model selection model is to select the 'best model configuration for each given time such that the accuracy of the prediction is improved.

The environment is acted upon at time t by an agent 22 through an action at. The action at comprises the agent 22 selecting a model configuration. That is, the action $a_t$ may be a retraining action (therein updating the model parameters of a model) and/or an action to change the hyperparameters of a model (e.g. increasing the greediness of a reinforcement learning model) and/or to select a different model (e.g. transition from using a reinforcement learning model for prediction to using a neural network for prediction). The agent 22, by acting upon the environment, causes the environment 20 to transition from its initial state $s_t$ (wherein a first model configuration is selected) to a new state $s_{t+1}$ (wherein a second model configuration is selected). It should be noted for completeness that the second model configuration may be equivalent to the first model configuration, if it is deemed beneficial to retain the same model configuration. That is, a different model configuration is selected if it exceeds the performance of the model configuration currently in use.

The transition from the initial state $s_t$ to the new state $s_{t+1}$ returns a reward $r_t$. The reward $r_t$ is a measure of the performance following the action made by the agent. For example, the reward $r_t$ may comprise an accuracy of a prediction (e.g. a predicted characteristic) made using the selected model configuration. The accuracy may be calculated using standard performance measurement techniques e.g. the area under a receiver operating characteristics (AUC-ROC) value or precision and recall.

The goal of the agent 22 is to maximise the total rewards of its actions over a trajectory, defined as a sequence of states, actions and rewards over a period of time ($s_0$, $a_0$, $r_0$, $s_1$, $a_1$, $r_1$, $s_2$, $a_2$, . . . ). The sequence of rewards over the trajectory is governed by a policy $\pi(\theta)$ which is itself governed by a set of parameters $\theta$ and has an associated total reward $J(\theta)$. The agent 22 aims to optimise the total reward $J(\theta)$. In some example implementations, to calculate the optimal total reward $J(\theta)$, gradient ascent (or descent) may be used e.g. calculating $\nabla_\theta J(\theta)$. There are different types of reinforcement learning techniques that may beneficially used. By way of example only, an actor critic algorithm, an advantage actor-critic algorithm, an asynchronous advantage actor-critic algorithm, a Q-learning with normalized advantage function, a trust region policy optimization algorithm, a proximal policy optimization algorithm, a twin delayed deep deterministic policy gradient, or a soft actor-critic algorithm may be used. The agent 22 may be trained using an initial training dataset. The agent 22 may also continuously learn based on the dataset D and rewards r received after each action at.

In order to help the agent 22 learn (and hence select more optimal model configurations), the model selection model is provided with a critic 24. The critic 24 receives the rewards $r_t$ from the environment 20 after each action at has been performed by the agent 22. The critic 24 also receives information relating to the new state $s_{t+1}$ of the environment 20, for example the dataset D and set of model configurations M. The critic 24 is governed by a policy $\pi(\omega)$ which is itself governed by a set of parameters $\omega$ and has an associated total reward $J(\omega)$. The goal of the critic 24 is to optimise its total reward $J(\omega)$ and provide a score to the agent 22 based on the rewards returned by the environment 20. As such, the critic 24 provides information $c_t$ (e.g. a performance indication) to the agent 22 allowing the agent 22 to further optimise its policy $\pi(\theta)$. The performance indication represents a measurement of the performance (e.g. accuracy) of the agent's actions. For example, the performance indication may represent the accuracy of a prediction using the model configuration selected by the agent 22. A performance indication can be determined analytically, for example using an advantage function or temporal difference.

Beneficially, such a model selection model provides a means of selecting a model configuration that improves predictions of a characteristic in an environment. By using the model selection model, the selection (and hence the improvement of predictions) may be performed without the need for manual intervention. By using the model selection model, the selection may be effected in real-time and/or responsive to drift events.

Use of such a model selection model is described in more detail below, with an example of a specific process of semiconductor manufacturing in an environment comprising a lithographic apparatus. It should be understood that this is illustrative in nature, and the methods and apparatuses described herein may be used for other applications, for example in the environments discussed above.

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). These fine-tuning steps may be referred to as corrections. Alternatively, tight control loops for controlling a stability of the lithographic apparatus may be used to improve reproduction of the pattern at low k1.

When the difficulties in lithographic patterning described above are not addressed, this may lead to a reduction in the quality of the patterning process. If the quality of a patterning process drops, this may result in a reduction in the quality of the final patterned substrate. Therefore, assessing the quality of a patterned substrate may give an indication of the patterning process quality. In order to test the quality of the patterned substrate, it may be tested whether the patterned substrate functions or not. The patterned substrate may comprise a plurality of elements (e.g., dies) which may be tested individually to determine whether the element passes, that is to say the element works, or whether it has failed (does not work). The proportion of elements on a substrate that work may be referred to as the yield of the substrate. It is desirable to improve the yield of a lithographic apparatus and corresponding patterning processes to obtain more working elements on a substrate.

Figure 3:
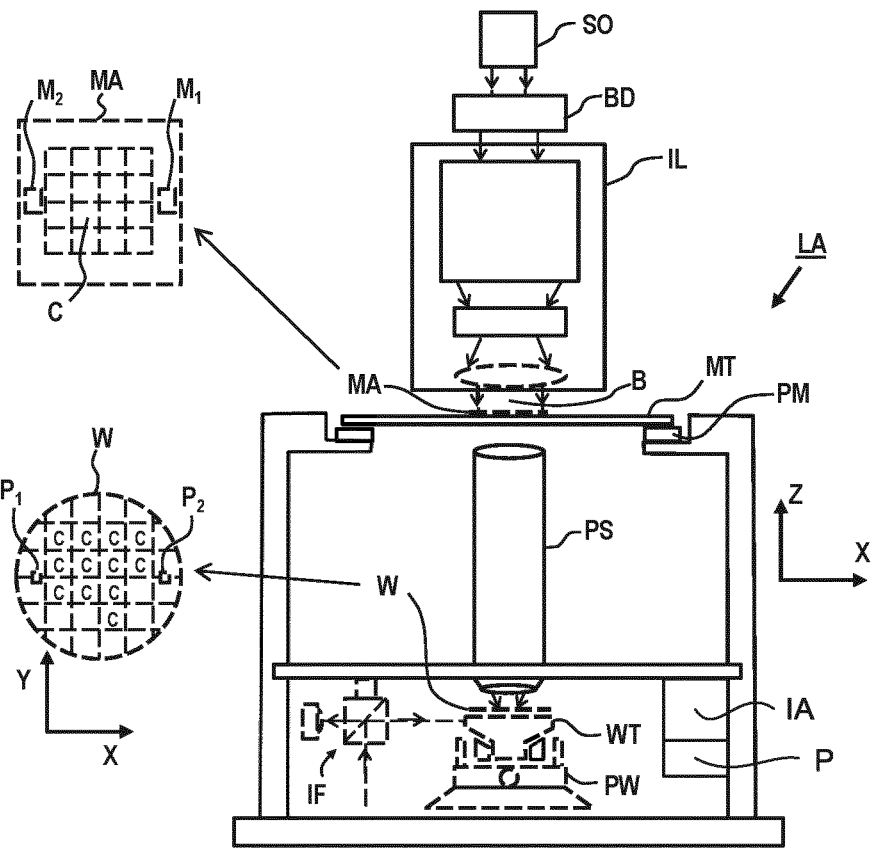
FIG. 3 depicts a schematic overview of a lithographic apparatus.

FIG. 3 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Typically, the patterning process in a lithographic apparatus LA is one of the most critical steps in the processing which requires high accuracy of dimensioning and placement of structures on the substrate W. It is desirable to monitor properties associated with the patterning process and/or substrate W and/or lithographic apparatus. Such properties may be referred to as features, measured features or monitored features.

The lithographic apparatus LA also comprises an inspection apparatus IA, which may also be referred to as a metrology tool. It should be noted that, in other example arrangements of a lithographic apparatus, the inspection apparatus IA may not be integrated into the lithographic apparatus but instead may be part of a larger lithographic system or be a stand-alone device. If integrated into the lithographic apparatus LA, the inspection apparatus IA may be positioned differently to that depicted in FIG. 3.

The inspection apparatus IA is arranged to inspect substrates to measure features of substrates W and patterned structures on substrates, such as overlay errors between subsequent layers, line thicknesses, critical dimensions (CD), etc. If errors are detected, corrections may be made, for example corrections to exposures of subsequent substrates or to other processing steps that are to be performed on the substrates W. The inspection apparatus IA may measure the features on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching). The inspection apparatus IA will typically monitor features and store values associated with the monitored features in a dataset.

Properties of the patterning process, for example a performance of the patterning process, may also be desirable to determine. Such a property may be referred to as a process metric. A process metric may be difficult to measure directly. Instead, the process metric may be assessed indirectly, for example by evaluating the quality of the final pattern present on the substrate. The process metric may be assessed by measuring a property representative of the process metric, for example a yield (e.g. the proportion of elements on a substrate which function adequately). A perfectly patterned substrate, where each die comprises a functioning element, has a yield of 100%. A substrate where all of the dies consist of non-working elements has a yield of 0%. Obtaining a yield of 100%, or as close to 100% as possible, is a target for high quality lithographic patterning. The yield may be measured with the inspection apparatus IA or another relevant measurement apparatus and evaluated using processing means.

The lithographic apparatus comprises a processor P, or other processing means. The processor P is operable to predict properties of the patterning process, for example a process metric of the patterning process. In particular, the processor P has access to a set of models, each configured to predict a process metric as described above and each having a model configuration. The set of models (and their corresponding configurations) are stored in computer storage means. Each model may be provided with data, for example values associated with features measured by the inspection apparatus IA, which it uses as an input to a prediction process. That is, the models can use features measured by the inspection apparatus IA to predict a process metric. The data may be current data, or may be stored historical data. Additional data may be provided as an input to the prediction process, for example operating parameters of the lithographic apparatus LA. The specifics of such models will not be described in detail here, but examples of models to predict process metrics in a semiconductor manufacturing process are described in more detail in more properties of models described in WO2018/202361, NL2024627 and European patent application EP19186833.0.

Beneficially, by using a model to predict a process metric, corrections may be calculated and applied proactively (i.e. before the yield is expected to pass a threshold) rather than retroactively (i.e. in response to the yield passing the threshold). As previously discussed, a semiconductor manufacturing process is a complex environment which typically experiences drift events. As such, a model selection model (for example that described with reference to FIG. 2) is used in combination with the lithographic apparatus LA to select a model configuration, thereby improving the accuracy of predictions.

Figure 4:
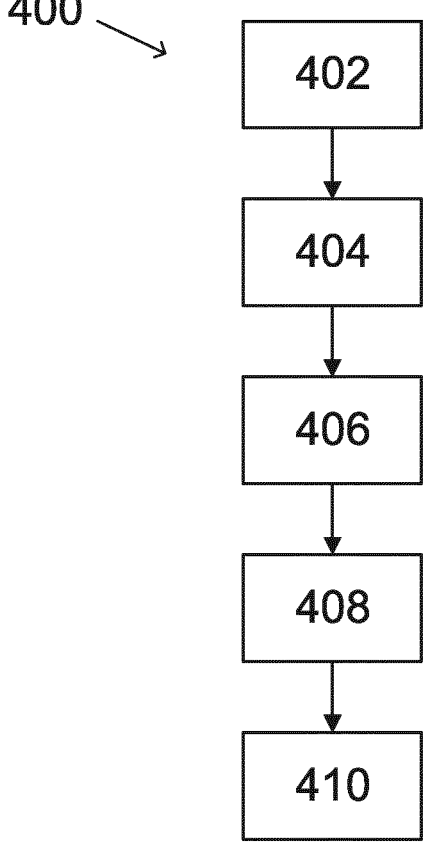
FIG. 4 depicts a flow diagram of steps in a method of selecting, from a plurality of model configurations, a model configuration from a plurality of model configurations for predicting a process metric associated with a process.

FIG. 4 depicts a flow diagram of a method 400 to select a model configuration such that the prediction of a process metric may be improved. The purpose of the method is to select, from a set of model configurations for predicting a process metric, a specific model configuration. Beneficially, by using this method, a model configuration may be selected that provides a more accurate prediction of the process metric. At a first step 402, process data is obtained. The process data comprises one or more values associated with features of the lithographic apparatus LA, substrate W, and/or patterning and one or more values associated with the plurality of model configurations. The process data may comprise, for example, a training set, a validation set and/or a test set of data. At a second step 404, a performance indication is evaluated for each model configuration of the set of model configurations M. In particular, the performance indication represents an accuracy of each model configuration for the prediction process for which it has been trained. The performance indication is based on the process data. The performance indication may, for example, be based on a test set which forms at least part of the process data.

At a third step 406, a model configuration is selected based on the evaluated performance indication. The model configuration selected may that with the 'best' performance indication, for example the highest accuracy. Alternatively the evaluated performance indication may be provided to an agent which uses historical information and/or algorithms with the performance indication to select a model configuration. At a fourth step 408, the model having the selected model configuration (i.e. a selected model) is used to predict the process metric. The selected model typically uses at least a portion of the dataset D as input to make its prediction. A predicted process metric is an output of the selected model. At a fifth step 410, the predicted process metric is outputted, by the computer.

Specific reference has been made herein to the use of process data comprising a training set, validation set and/or test set. The terms training set, validation set and test set are to be interpreted as they are used in the art, as types of dataset which are input to a model. Typically, a training set is used to tune model parameters. Typically, a validation set is used to tune model hyperparameters. Typically, a test set is used to provide a measure of performance of a model. However, given that the methods herein provide a means for tuning the model parameters and model hyperparameters and evaluating the performance of different model configurations, any type of dataset may be chosen as process data.

The method 400 can be used alongside reinforcement learning techniques, for example the model selection model 200 described with reference to FIG. 2. In such an example implementation, the critic 24 obtains (at step 402) process data. The process data comprises values associated with the state $s_{t+1}$ of the environment (e.g. the set of model configurations M and one or more features of the substrate/process/apparatus) at a time t+1. The process data also comprises a reward $r_t$ (e.g. an indication of prediction accuracy) at a previous time t following an action $a_t$ made by the agent 22 (e.g. updating the model parameters of the selected model). That is, the reward is a measure of the accuracy of a previously predicted process metric using a previously selected model configuration. The critic 24 then evaluates (at step 404) a performance indication $c_t$ based on the obtained process data, and provides said performance indication $c_t$ to the agent 22.

Given the new information (i.e. performance indication $c_t$) the agent 22 selects (at step 406) a model configuration. A model with the selected model configuration is then used to predict (at step 408) the process metric, for example yield. Said process metric is output (at step 410). Based on this method 400, the agent 22 learns to select a more optimal model configuration in real-time based on the performance indications received from the critic 24. The method 400 is iterative and may be repeated over time. With each iteration of the method 400 (e.g. at time t, t+1, t+2 . . . ) the agent 22 and critic 24 can learn based on the evaluated rewards or performance indications, and from additional data received from the updated environment (e.g. the state $(s_t, s_{t+1} . . .)$ of the environment 20 following each action $(a_t, a_{t+1} . . .)$. Additionally, with each iteration of the method 400, additional values (e.g. measured and/or predicted values of a property) may be added to the dataset D, thereby increasing the size of the dataset D.

When using reinforcement learning techniques to perform the method 400, the method steps may be performed as at least part of a model-free reinforcement learning (MFRL) framework. The MFRL framework may use a policy-based framework, which uses a policy function $J(\theta)$ to define a selection approach for selecting a model configuration. The selection approach governs the way in which the model configuration is selected. The selection approach is typically an algorithm which may be based on the total rewards over a trajectory, where different selection algorithms use a different algorithm and/or different length trajectory and/or different weightings for different points of the trajectory. A value function $V(\theta)$ may also be used. The value function $V(\theta)$ defines an enhancement of the predicted process metric if the current policy function $J(\theta)$ is followed until the completion of the trajectory (i.e. the end of the policy function). The performance indication determined by the critic is automatically derived using gradient ascent (i.e. $\nabla_\theta J(\theta)$). With each iteration of the method 400, the policy function $P(s)$ is updated, thereby 'optimising' it for the selection of a model configuration which yields more accurate predictions.

The critic 24 may be referred to as an evaluation tool. The policy function of the critic 24 is referred to as an evaluation model, and is configured to evaluate a performance indication and deliver said performance indication to the agent 22. Training the critic 24 may comprise initialising and/or updating its policy function. The critic 24 can be trained initially using training data, for example data from the dataset D and/or historical data or model parameters from another model selection model. Additionally or alternatively, the critic 24 can be trained in use, by it receiving the process data, and optionally other values from the dataset D, and values associated with the model configurations (e.g. a reward), and updating its policy function based thereon. This training may be performed iteratively each time the method 400 is performed.

The agent may be referred to as a selection tool. The policy function of the agent 22 is referred to as a selection model, and is configured to select a model configuration. Training the agent 22 may comprise initialising and/or updating its policy function. The agent 22 can be training initially using training data, for example data from the dataset D and/or historical data or model parameters from another model selection model. Additionally or alternatively, the agent 22 can be trained in use, by it receiving the performance indications, optionally other values from the dataset D, and values associated with features of the environment, and updating its policy function based thereon. This training may be performed iteratively each time the method 400 is performed.

The method 400 can be performed by a computer processing means, for example the processor P in FIG. 3. The computer processing means has access to a memory, within which the set of models are stored. Each model of the set of models is configured to predict a process metric (e.g. yield) and has been trained accordingly. Each model has a model configuration which comprises model parameters (e.g. parameters set through training), model hyperparameters (e.g. number of layers, greediness), and optionally a model type (e.g. neural network, SVM, random forest). Each model of the set typically has access to the dataset D of values associated with features of the patterning process, substrate W, and/or the lithographic apparatus LA, for example features monitored by an inspection apparatus IA.

In a specific example the dataset D specifically contains data relating to a drift status of the lithographic apparatus LA. Such data may be referred to as drift data. Using a dataset D containing a drift status is particularly advantageous when drift events occur. Drift data may be determined by, for example, monitoring a feature associated with the substrate, and determining drift events based on changes in the monitored overlay measurement. That is, drift data may be associated with the way a feature changes over time. For example, an overlay measurement may be monitored over time and, if the overlay measurement gradually increases over a period of time, an incremental population drift event may be identified.

The drift data may be included in the process data obtained in step 402 of the method 400. In the event of drift events, the critic 24, through its evaluation of performance indicators based on the process data, may encourage the selection (by the agent 22) of a specific model configuration which may predict with increased accuracy following such a drift event. In particular, both the critic 24 and agent 22 may learn over time that specific model configurations may yield more accurate predictions following corresponding specific drift events.

In another example, the process data may comprise a contents value indicating the number of values the dataset D contains. The contents value may indicate the number of values in the dataset D in entirety, or may indicate the number of values associated with a particular property, for example values associated with an overlay measurement. Such a process data comprising a contents value may be particularly advantageous for selecting the model configuration, at least in part, based on the contents value associated with a property. In particular, some types of model are more prone to overfitting, so are typically more accurate when more training data is available. That is, it may be beneficial to use a first model type (e.g. a support vector machine) when the dataset D is small, but as the dataset D grows in size (e.g. as more iterations of the method 400 are performed) it may be beneficial to transition to a second model type (e.g. a neural network).

Selecting a model configuration may comprise one of a number of actions. In a first example, the selected model at a time t (denoted $M_t$) has the same model configuration as a model previously selected at time t–1 (denoted $M_{t-1}$). That is, it is determined that the most accurate prediction of the process metric is likely to be made by the same model as that previously selected ($M_{t-1}$). This first example is more likely in a stable system with no drift events occurring between time t–1 and time t.

In a second example, the selected model at time t ($M_t$) has a different model configuration compared to the previously selected model ($M_{t-1}$). In the second example, selecting a model configuration comprises selecting a model configuration with a different model type. For example, if the previously selected model $M_{t-1}$ was a support vector machine, selecting a model configuration may comprise selecting a new model $M_t$ which has a neural network architecture. The second example is likely to be particularly beneficial in a system which uses process data comprising a contents value as described above.

In a third example, the selected model at time t ($M_t$) has a different model configuration compared to the previously selected model ($M_{t-1}$). In the third example, selecting a model configuration comprises changing a hyperparameter of a selected model. That is, the new model $M_t$ may be generally equivalent to the previously selected model $M_{t-1}$ but one or more hyperparameters may be changed. For example, it may be beneficial, when using a model of a reinforcement learning type, to reduce the greediness of the model over time.

In a fourth example, the selected model at time t ($M_t$) has a different model configuration compared to the previously selected model ($M_{t-1}$). In the fourth example, selecting a model configuration comprises changing one or more model parameters. That is, a selected model is retrained to update its model parameters. The fourth example is particularly advantageous following a drift event, as the selected model may be retrained using training data associated with a state of the environment following the drift event. As such, by retraining the model following a drift event, the process metric may be determined with increased accuracy following a drift event.

The method 400 provides, as an output, a predicted process metric. In an example implementation of the method 400, the output process metric is used to determine a correction to the lithographic apparatus LA and/or patterning process. The correction may also be referred to as an adjustment. The correction is calculated so as to improve the performance of the lithographic apparatus LA and/or patterning process. Examples of corrections are an adjustment to an optical component of the apparatus, an adjustment of a dose provided to the lithographic apparatus, a change in the pattern to be applied.

Such a correction may then be applied to the apparatus, which may improve its performance. As such, the process metric may improve e.g. a correction may lead to an improved yield. In such an instance, the lithographic apparatus LA comprises both a processor P operable to determine the correction, and means to apply said correction. It may be chosen to apply the correction selectively, for example if the predicted process metric passes a threshold. In an example, it is beneficial to apply a correction only if the predicted yield falls below 80%. Alternatively, it may be beneficial to apply a correction periodically.

In another example implementation, the predicted process metric is used to generate data indicative of the process. For example, the process metric may be used to generate a map over an area associated with the process. A series of predicted process metrics may be generated for a probability of failure of a patterning process at given locations on a semiconductor wafer. Given said series of predicted process metrics, a map may be generated showing the probability of failure across the entire wafer. Alternative maps may be generated, for example an overlay map showing the predicted overlay for multiple layers following patterning processes.

In another example implementation, the predicted process metric is provided back to the model as an input, for example to train the model and thereby improve its predictions.

Further embodiments of the invention are disclosed in the list of numbered clauses below:

1. A computer implemented method of selecting, from a plurality of model configurations, a model configuration for predicting a process metric associated with a process, the method comprising:
  obtaining process data comprising values associated with the plurality of model configurations and a value associated with a feature of the process;
  evaluating a performance indication for each model configuration of the plurality of model configurations based on the process data;
  selecting a model configuration based on the evaluated performance indication;
  predicting the process metric using a model having the selected model configuration;
  outputting, by the computer, the predicted process metric.
2. The method of clause 1, wherein the value associated with a feature of the process comprises data associated with a way the feature changes over time.
3. The method of clause 1 or 2, wherein each model configuration comprises one or more of a model type, model parameters and/or model hyperparameters.
4. The method of clause 3, wherein the model type comprises a support vector machine, a neural network, or a random forest.
5. The method of clause 3 or 4, wherein selecting a model configuration comprises retraining a model to update its model parameters.

6. The method of any preceding clause, wherein selecting the model configuration is further based on a dataset comprising values associated with the feature of the process.
7. The method of clause 6, wherein selecting the model configuration is further based a size of the dataset or a size of a subset of the dataset.
8. The method of any preceding clause, wherein the method steps are performed using reinforcement learning.
9. The method of clause 8, wherein the steps of obtaining process data, evaluating a performance metric and selecting a model configuration are performed using one or more of: an actor critic algorithm, an advantage actor-critic algorithm, an asynchronous advantage actor-critic algorithm, a Q-learning with normalized advantage function, a trust region policy optimization algorithm, a proximal policy optimization algorithm, a twin delayed deep deterministic policy gradient, or a soft actor-critic algorithm.
10. The method of any of clause 8 or 9, wherein the steps of obtaining process data and evaluating a performance metric are performed by one or more processors comprising a critic and the step of selecting a model configuration is performed by one or more processors comprising an agent.
11. The method of any of clauses 8 to 10, wherein the steps of obtaining process data, evaluating a performance metric and selecting a model configuration comprise:
  determining a policy function, $J(\theta)$, that defines a selection approach for selecting a model configuration; and/or
  determining a value function, $V(\theta)$, that defines an enhancement of the process metric prediction assuming the policy function is followed until completion of the policy function.
12. The method of any preceding clause, further comprising determining a correction to the process based on the predicted process metric.
13. The method of clause 12, further comprising applying said correction to the process.
14. The method of any preceding clause wherein the process comprises a semiconductor manufacturing process.
15. The method of clause 14 when dependent on clause 12 or 13, wherein the correction is determined to adjust an optical and/or mechanical parameter of a semiconductor manufacturing apparatus arranged to perform the semiconductor manufacturing process, or to change a processing step of the semiconductor manufacturing process.
16. The method of clause 14 or 15, wherein the value associated with a feature of the process is generated by an inspection apparatus arranged to monitor at least a portion of the semiconductor manufacturing process.
17. A method of training an evaluation model for evaluating a performance indication for each model configuration of a plurality of model configurations, for a set of models having said plurality of model configurations and being configured to predict a process metric associated with a process, the method comprising:
  receiving prediction data relating to a predicted process metric predicted by at least one of the set of models;
  receiving values associated with a feature of the process;
  training the evaluation model based on the received values and received prediction data.
18. A method of training a selection model for selecting a model configuration from a plurality of model configurations, for a set of models having said plurality of model configurations and being configured to predict a process metric associated with a process, the method comprising:
  receiving values associated with a feature of the process;

receiving a performance indication indicative of the performance of a specific predicted process metric predicted using a specific model configuration;

training the selection model based on the received values and received performance indication.

19. A machine learning model trained according to clauses 17 or 18.

20. A method, the method comprising:

obtaining one or more models configured for predicting a process metric of a manufacturing process based on inputting process data; and using a reinforcement learning framework to evaluate said one or more models and/or model configurations of said one more models based on inputting new process data to the one or more models and determining a performance indication of the one or more models and/or model configurations in predicting the process metric based on inputting the new process data.

21. The method of clause 20, wherein the process metric is associated with a yield or quality parameter of the manufacturing process.

22. The method of clause 20 or 21, wherein the configuration comprises one or more of a model type, model parameters and/or model hyperparameters.

23. The method of any of clauses 20 to 22, wherein the process data and new process data comprise features of the manufacturing process.

24. The method of any of clauses 20 to 23, wherein the manufacturing process comprises a process of patterning semiconductor wafers.

25. The method of any of clauses 20 to 24, wherein the performance in predicting the process metric is based on comparing the predicted characteristic and an otherwise obtained value of the process metric.

26. The method of any of clauses 20 to 25, further comprising a step of selecting a model and/or model configuration based on the evaluation.

27. The method of clause 26, wherein the process metric is indicative of the quality of a substrate being subject to the patterning process.

28. The method of any of clauses 20 to 27, wherein the process data comprises Key Performance Indicators (KPIs) associated with a plurality of functional modules involved in the manufacturing process.

29. The method of any of clauses 20 to 28, wherein the one or more models comprise at least two machine learning based models, each model being of a different architecture.

30. The method of clause 29, wherein the one or more models comprise at least a first model based on supervised learning and a second model based on unsupervised learning.

31. A computer program comprising instructions operable to execute the method of any of clauses 1 to 18 or 20 to 30, when run on a suitable apparatus.

32. A computer storage medium comprising the computer program of clause 31.

33. A semiconductor manufacturing apparatus comprising processing means and a storage medium comprising instructions operable to execute the method of any of clauses 1 to 18 or 20 to 30.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions. Additionally, the methods described herein may be used in non-lithographic apparatus. For example, a wide range of environments have been described herein within which the methods may be used to determine a more accurate process metric.

The methods described herein have made specific reference to predicting the yield as a process metric. However, the methods may be used for the prediction of any other process metric. In a semiconductor manufacturing environment, such process metrics may comprise a quality, a probability of patterning failure, a probability of a part failure, a diagnostic status. In other environments, other process metrics may be predicted, for example a probability of failure of a process e.g. an estimate of misdiagnosis in an ex-vivo diagnostic tool.

The methods described herein refer to a method of selecting, from a plurality of model configurations, a model configuration for predicting a process metric associated with a process. However, in some example implementations it may be beneficial to select more than one model configuration. For example, it may be beneficial to predict a first process metric using a first model configuration and a second process metric using a second model configuration. The first and second process metrics may comprise the same metric (e.g. yield) or may comprise different metrics (e.g. yield and probability of part failure).

The methods described herein may be implemented as instructions in a computer program. The computer program may be executed on an apparatus, for example a inspection apparatus IA, an inspection apparatus, or a lithographic apparatus LA. Such a computer program may be stored on a computer storage medium.

Although specific reference may have been made above to the use of embodiments of the invention in the context of optical lithography, it will be appreciated that the invention, where the context allows, is not limited to optical lithography and may be used in other applications, for example imprint lithography, etching, developing (e.g. development of resists such as photoresist) and chemical mechanical polishing.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A method comprising:

obtaining one or more models configured for predicting a process metric of a manufacturing process based on inputting process data, the process data comprising one or more Key Performance Indicators (KPIs) associated with a plurality of functional modules involved in the manufacturing process; and using, by a hardware computer system, a reinforcement learning framework to evaluate the one or more models and/or model configurations of the one more models based on inputting new process data to the one or more models and determining an indication of a performance of the one or more models and/or model configurations in predicting the process metric based on inputting the new process data.

2. The method of claim 1, wherein the process metric is associated with a yield or quality parameter of the manufacturing process.

3. The method of claim 1, wherein the configuration comprises one or more selected from: a model type, model parameters and/or model hyperparameters.

4. The method of claim 1, wherein the process data and new process data comprise features of the manufacturing process.

5. The method of claim 1, wherein the manufacturing process is a process of patterning semiconductor wafers.

6. The method of claim 1, wherein the performance in predicting the process metric is based on comparing the predicted process metric and an otherwise obtained value of the process metric.

7. The method of claim 1, further comprising selecting a model and/or model configuration based on the evaluation.

8. The method of claim 7, wherein the process metric is indicative of the quality of a substrate being subject to a patterning process.

9. The method of claim 1, wherein the one or more models comprise at least two machine learning based models, each model being of a different architecture.

10. The method of claim 9, wherein the one or more models comprise at least a first model based on supervised learning and a second model based on unsupervised learning.

11. A semiconductor manufacturing apparatus comprising a computer processor and a storage medium comprising instructions operable to execute the method of claim 1.

12. A computer program product comprising a non-transitory computer-readable storage medium having instructions therein, the instructions, when executed by a computer system, configured to cause the computer system to at least:

obtain one or more models configured for predicting a process metric of a manufacturing process based on inputting process data, the process data comprising one or more Key Performance Indicators (KPIs) associated with a plurality of functional modules involved in the manufacturing process; and use a reinforcement learning framework to evaluate the one or more models and/or model configurations of the one more models based on inputting new process data to the one or more models and determine an indication of a performance of the one or more models and/or model configurations in predicting the process metric based on inputting the new process data.

13. The computer program product of claim 12, wherein the process metric is associated with a yield or quality parameter of the manufacturing process.

14. The computer program product of claim 12, wherein the configuration comprises one or more selected from: a model type, model parameters and/or model hyperparameters.

15. The computer program product of claim 12, wherein the process data and new process data comprise features of the manufacturing process.

16. The computer program product of claim 12, wherein the performance in predicting the process metric is based on comparison of the predicted process metric and an otherwise obtained value of the process metric.

17. The computer program product of claim 12, wherein the one or more models comprise at least two machine learning based models, each model being of a different architecture.

18. A computer program product comprising a non-transitory computer-readable storage medium having instructions therein, the instructions, when executed by a computer system, configured to cause the computer system to at least:

obtain one or more models configured for predicting a process metric of a manufacturing process based on inputting process data, wherein the process metric is indicative of the quality of a substrate being subject to a patterning process;

use a reinforcement learning framework to evaluate the one or more models and/or model configurations of the one more models based on inputting new process data to the one or more models and determine an indication of a performance of the one or more models and/or model configurations in predicting the process metric based on inputting the new process data;

select a model and/or model configuration based on the evaluation.

* * * * *